United States Patent
Hu

(10) Patent No.: US 10,281,816 B2
(45) Date of Patent: May 7, 2019

(54) CARRYING PLATFORM FOR CARRYING MASK PLATE, MASK PLATE AND MASK PLATE SECURING ASSEMBLY

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Bin Hu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/824,856

(22) Filed: Nov. 28, 2017

(65) Prior Publication Data
US 2018/0299769 A1 Oct. 18, 2018

(30) Foreign Application Priority Data
Apr. 12, 2017 (CN) .................. 2017 2 0388938 U

(51) Int. Cl.
*G02F 1/1333* (2006.01)
*G03F 1/50* (2012.01)
(Continued)

(52) U.S. Cl.
CPC .............. *G03F 1/68* (2013.01); *G02F 1/1333* (2013.01); *G03F 1/50* (2013.01); *G03F 7/70775* (2013.01);
(Continued)

(58) Field of Classification Search
CPC .. G03F 7/707; G03F 7/70775; G03F 7/70783; G03F 7/70741; G03F 7/70825; F03F 7/70708

See application file for complete search history.

(56) References Cited

U.S. PATENT DOCUMENTS 6,003,828 A * 12/1999 Kawahashi ........... G03F 7/2002
248/576
7,466,397 B2 * 12/2008 Van De Ven ........... G03F 7/707
355/72

(Continued)

*Primary Examiner* — Hung Nguyen
(74) *Attorney, Agent, or Firm* — Brooks Kushman P.C.

(57) ABSTRACT

The present disclosure discloses a carrying platform for carrying a mask plate. The carrying platform includes a body and a first securing structure disposed on the body. The first securing structure is to engage with a second securing structure of the mask plate. The first securing structure includes supporting rods disposed on the body, and the supporting rods are to be in contact with an edge region of the mask plate. An engagement between the first securing structure and the second securing structure enables the mask plate to be switched between a first state and a second state in such a manner that in the first state, the mask plate is in contact with a first supporting rod of the supporting rods and rotates about an axis of the first supporting rod in the horizontal plane, and in the second state, the mask plate is in contact with at least two of the supporting rods and is fixed relative to the carrying platform.

11 Claims, 7 Drawing Sheets

(51) Int. Cl.
*G03F 1/68* (2012.01)
*G03F 7/20* (2006.01)
*G03F 9/00* (2006.01)

(52) U.S. Cl.
CPC .... *G03F 9/00* (2013.01); *G02F 2001/133354* (2013.01)

(56) References Cited

U.S. PATENT DOCUMENTS 8,885,149 B2 * 11/2014 Amin-Shahidi .... G03F 7/70725 355/72
9,013,682 B2 * 4/2015 Compen ................ G03F 7/707 355/30

* cited by examiner

CARRYING PLATFORM FOR CARRYING MASK PLATE, MASK PLATE AND MASK PLATE SECURING ASSEMBLY

CROSS-REFERENCE TO RELATED APPLICATION

This application claims priority to Chinese Patent Application No. 201720388938.4 filed on Apr. 12, 2017, which is incorporated herein by reference in its entirety.

TECHNICAL FIELD

The present disclosure relates to the field of manufacturing liquid crystal products, and in particular to a carrying platform for carrying a mask plate and a mask plate and a mask plate securing assembly.

BACKGROUND

In the process of manufacturing active-matrix organic light emitting diode (AMOLED) display devices, mask plates are usually used for vapor deposition. Before the vapor deposition, it is needed to place one mask plate on a carrying platform of a lithography system. Before performing photolithography, it is needed to ensure that a mask mark of the mask plate is within CCD field of view. After the mask plate is aligned, the photolithography can be performed successively. In the above process, it is needed to hold or fix the mask plate within a region. However, in the related art, a position of the mask plate on the carting platform is stable, which easily causes color mixing on edges of display devices.

SUMMARY

In order to solve the above technical problem, the present disclosure provides a carrying platform for carrying a mask plate and a mask plate and a mask plate securing assembly, which can improve stability of the mask plate on the carting platform and reduce rate of occurrence of color mixing.

In order to achieve the above object, technical solutions adopted in the present disclosure are as follows.

One embodiment of the present disclosure provides a carrying platform for carrying a mask plate, which includes a body and a first securing structure disposed on the body. The first securing structure is configured to engage with a second securing structure of the mask plate. The first securing structure includes a plurality of supporting rods disposed on the body, and the supporting rods are configured to be in contact with an edge region of the mask plate. An engagement between the first securing structure and the second securing structure enables the mask plate to be switched between a first state and a second state in such a manner that in the first state, the mask plate is in contact with a first supporting rod of the supporting rods and rotates about an axis of the first supporting rod in the horizontal plane, and in the second state, the mask plate is in contact with at least two of the supporting rods and is fixed relative to the carrying platform.

Further, the first securing structure includes four supporting rods disposed on the body, and the four supporting rods are corresponding to four corners of the mask plate in a one-to-one manner.

Further, one end of each supporting rod where each supporting rod is in contact with the mask plate, is of a spherical structure.

Further, the carrying platform further includes an adjustment structure that is configured to adjust a height of each supporting rod so that the mask plate on the carrying platform is substantially parallel to the horizontal plane.

Further, the adjustment structure includes a first connection rod and a second connection rod, and the second connection rod is telescopically mounted on the first connection rod, thereby forming a rod body of one of the supporting rods.

Further, the adjustment structure further includes a cylinder or a motor, and an output shaft of the cylinder or the motor is connected with the first connection rod.

Further, the adjustment structure further includes a connection block elastically mounted to the first connection rod by means of an elastic member; a plurality of through holes is defined through an outer circumferential wall of the second connection rod and is arranged along an axial direction of the second connection rod; one portion of the connection block protrudes from an outer circumferential wall of the first connection rod and extends into one of the through holes.

Further, the body includes a hollow chamber; the adjustment structure includes a rail disposed in the hollow chamber; and one of the supporting rods is movably mounted on the rail.

One embodiment of the present disclosure provides a mask plate, which includes a substrate and a second securing structure on the substrate. The second securing structure is configured to engage with a first securing structure of a carrying platform when the mask plate is carried by the carrying platform. The second securing structure includes a first connection portion disposed at an edge region of a surface of the substrate which faces the carrying platform, and an engagement between the first connection portion and the first securing structure enables the mask plate to be capable of rotating in a horizontal plane. The second securing structure further includes a second connection portion disposed at the edge region of the surface of the substrate which faces the carrying platform, and an engagement between the second connection portion and the first securing structure enables the mask plate to be secured relative to the carrying platform.

Further, the first connection portion includes a first groove defined in a first corner of the mask plate, and an inner surface of the first groove is a curve structure that matches the first securing structure, thereby enabling the mask plate to rotate in the horizontal plane.

Further, the second connection portion includes a second groove defined in a second corner of the mask plate, the second groove is a strip-shaped groove, and a length direction of the strip-shaped groove is a direction from the first connection portion to the second connection portion.

Further, a shape of a cross section of the second groove in a plane perpendicular to the mask plate is a trapezoid, one side of the trapezoid away from the carrying platform has a length shorter than that of another side of the trapezoid close to the carrying platform.

Further, the second securing structure further includes a bowl-shaped structure protruded from the edge region of the surface of the substrate which faces the carrying platform, and the first connection portion is a recess of the bowl-shaped structure.

Further, the second securing structure further includes a protruding structure protruded from the edge region of the surface of the substrate which faces the carrying platform, the protruding structure defines a trapezoidal recess therein, and the second connection portion is the trapezoidal recess of the protruding structure.

One embodiment of the present disclosure further provides a mask plate securing assembly, which includes a carrying platform; a mask plate stacked on the carrying platform in a first direction perpendicular to the carrying platform; a first connection portion disposed at a surface of the mask plate which faces the carrying platform; a second connection portion disposed at the surface of the mask plate which faces the carrying platform, where the second connection portion is spaced from the first connection portion; a first supporting rod on the carrying platform, where the first supporting rod is configured to move relative to the carrying platform and the mask plate, thereby enabling a free end of the first supporting rod to pivotally engage with or disengage from the first connection portion; and a second supporting rod on the carrying platform, where the second supporting rod is configured to move relative to the carrying platform and the mask plate, thereby enabling a free end of the second supporting rod to engage with the second connection structure so as to limit rotation of the free end of the first supporting rod relative to the first connection portion, or enabling the free end of the second supporting rod to disengage from the second connection portion.

Further, the free end of the first supporting rod is of a spherical structure; the free end of the second supporting rod is of a spherical structure; the first connection portion includes a curved structure that pivotally engages with the spherical structure of the first supporting rod; the second connection portion includes a strip-shaped groove, and a length direction of the strip-shaped groove is a direction from the first connection portion to the second connection portion.

Further, a shape of a cross section of the second groove in a plane perpendicular to the mask plate is a trapezoid, one side of the trapezoid away from the carrying platform has a length shorter than that of another side of the trapezoid close to the carrying platform.

Further, the mask plate securing assembly further includes an adjustment structure configured to adjust heights of the first supporting rod and the second supporting rod relative to the carrying platform.

Further, the first direction is perpendicular to the carrying platform and the mask plate.

Further, the first supporting rod and the second supporting rod are located between the carrying platform and the mask plate.

BRIEF DESCRIPTION OF THE DRAWINGS

The accompanying drawings, which are incorporated in and constitute a part of this specification, illustrate embodiments consistent with the disclosure and, together with the description, serve to explain the principles of the present disclosure.

DETAILED DESCRIPTION

In order to make the objects, the technical solutions and the advantages of the present disclosure more apparent, the present invention will be described hereinafter in conjunction with the drawings. Obviously, the followings are merely a part of, rather than all of, the embodiments, and the other embodiments obtained by a person skilled in the art based on these embodiments, without any creative effort, shall also fall within the scope of the present invention.

Figure 1:
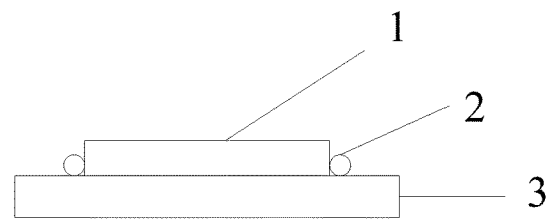
FIG. 1 is a schematic view of a mask plate secured on a carrying platform in the related art.

As shown in FIG. 1, in the related art, a mask plate 1 is usually secured on a carrying platform 3 by means of bearings 2. In the process of positioning the mask plate 1, the bearings 2 play two functions including guidance and restriction. However, the above manner has the following disadvantages.

1. Since the bearings 2 play a role of guiding, the bearings 2 are always pressed by the mask plate 1 and then are easy to loosen, resulting in deviation of positions of the bearings 2 which then adversely affects the restriction function of the bearings 2 and then leads a mask mark of the mask plate to deviate from CCD field of view;

2. Ideally, when the mask plate 1 reaches a predetermined position, sides of the mask plate 1 are separated from the bearings 2 with a distance of 0.1 mm. However, in actual situation, the relative position of the mask plate 1 and the bearings 2 are not fixed, for example, one side of the mask plate 1 may be in tight contact with the bearing 2, and then force is applied to an edge of the mask plate 1, an edge FMM sheet PPA (which refers to an offset amount which is caused by that a vapor deposition film will be shifted in position relative to pixels in the process of evaporation when the mask plate offsets in case that uneven force are applied to edges of the mask plate) changes, which results in color mixing at the edges of the display device.

In order to solve the above technical problem, the present disclosure provides a carrying platform for carrying a mask plate and a mask plate and a mask plate securing assembly, which can improve stability of the mask plate on the carting platform and reduce rate of occurrence of color mixing.

Figure 2:
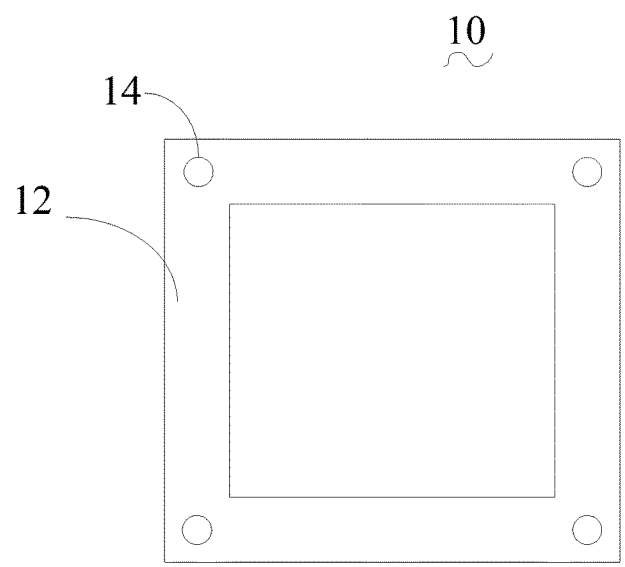
FIG. 2 is a top view of a carrying platform according to an embodiment of the present disclosure.
Figure 3:
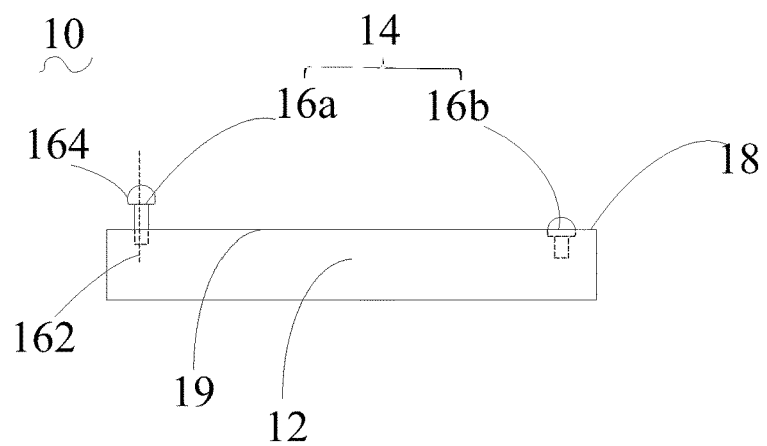
FIG. 3 is a side view of a carrying platform according to an embodiment of the present disclosure.

As shown in FIG. 2 and FIG. 3, one embodiment of the present disclosure provides a carrying platform 10 for carrying mask plates. The carrying platform 10 includes a body 12 and first securing structure 14 disposed at the body 12. The first securing structure 14 is able to engage with a second securing structure of a to-be-carried mask plate 20

Figure 4:
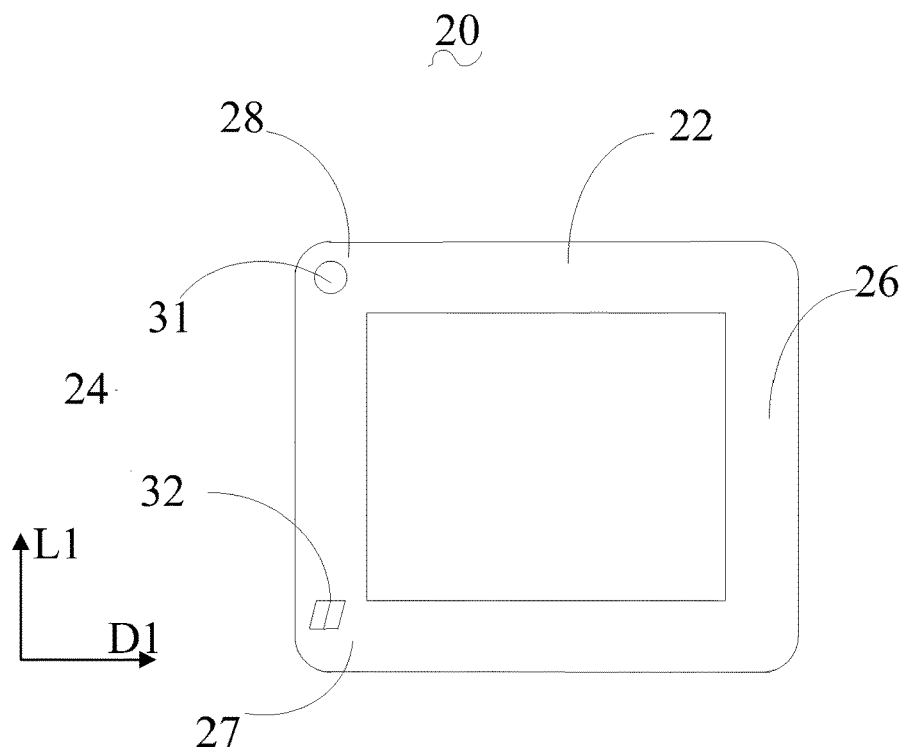
FIG. 4 is a schematic view of a mask plate according to an embodiment of the present disclosure.

(as shown in FIG. 4). The first securing structure 14 includes a plurality of supporting rods 16 disposed on the body 12. The supporting rods 16 are able to be in contact with an edge region of the to-be-carried mask plate 20. The engagement between the first securing structure 14 and the second securing structure can enable the to-be-carried mask plate 20 to be switched between a first state and a second state.

In the first state, the to-be-carried mask plate 20 is in contact with a first supporting rod 16a of the supporting rods 16, and is capable of rotating about an axis 162 of the first supporting rod 16a in a horizontal plane (which is parallel to a top surface 18 of the carrying platform 10 when the carrying platform 10 is at a position shown in FIG. 3). In the second state, the to-be-carried mask plate 20 is in contact with at least two of the supporting rods 16, and is fixed relative to the carrying platform 10.

The engagement between the first securing structure 14 of the carrying platform 10 and the second securing structure of the mask plate 20 can hold the mask plate 20 in a predetermined region 19 of the carrying platform 10. Further, the first securing structure 14 supports and fixes the mask plate 20 with the supporting rods 16 in such a manner that in the first state, the mask plate 20 is capable of rotating about the axis 162 of the first supporting rod 16a in the horizontal plane so as to adjust positions of the mask plate 20 in the horizontal plane, and in the second state, the to-be-carried mask plate 20 is fixed relative to the carrying platform 10 so as to reduce force applied on edges of the to-be-carried mask plate 20 and then reduce rate of occurrence of color mixing at the edges of the to-be-carried mask plate 20.

In one embodiment of the present disclosure, the first securing structure 14 includes four supporting rods 16 disposed at the body 12 of the carrying platform 10. The four supporting rods 16 are corresponding to four corners of the mask plate 20 in a one-to-one manner. The presence of four supporting rods 16 is sufficient to support the to-be-carried mask plate 20. Further, since the four supporting rods 16 are corresponding to four corners of the mask plate 20 in a one-to-one manner, it is ensured that the to-be-carried mask plate 20 can be stably located within the horizontal plane.

It should be noted that, the specific structures of the first securing structure 14 may be varied, as long as the first securing structure 14 can engage with the second securing structure to hold the mask plate 20 with the predetermined region 19 of the carrying platform 10. The number of the supporting rods 16 may also be varied, as along as the supporting rods 16 can carry stably the mask plate 20. The positions of the four supporting rods 16 are not limited to be corresponding to corners of the mask plate 20, and the positions of the four supporting rods 16 may also be corresponding to other positions at the edge region of the mask plate 20.

In one embodiment of the present disclosure, one end of the supporting rod 16 where the supporting rod 16 is in contact with the mask plate 20, is of a spherical structure 164. The presence of the spherical structure 164 facilitates fine adjustment of the position of the mask plate 20, and can also prevent the mask plate 20 from being damaged by the supporting rod 16 in the process of adjusting the position of the mask plate 20.

In one embodiment of the present disclosure, the carrying platform 10 further includes an adjustment structure, which is to adjust a height of each supporting rod 16 relative to the top surface 18 of the body 12, so that the mask plate 20 on the carrying platform 10 is parallel to the horizontal plane. The specific structure of the adjustment structure may be varied, as along as the adjustment structure can adjust the height of each supporting rod 16.

Figure 7:
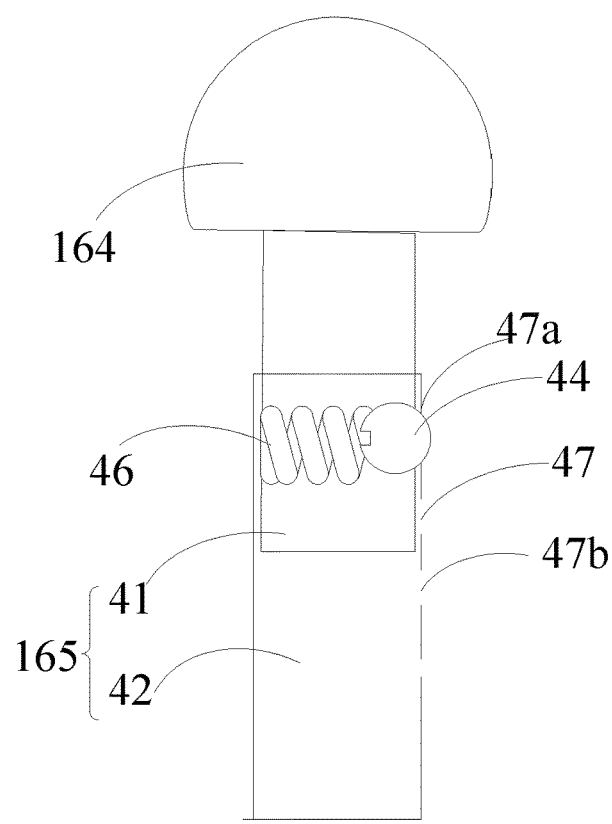
FIG. 7 is a schematic view of a supporting rod according to an embodiment of the present disclosure.

In one embodiment of the present disclosure, as shown in FIG. 7, the adjustment structure includes a first connection rod 41 and a second connection rod 42. The second connection rod 42 is telescopically mounted on the first connection rod 41, thereby forming a rod body 165 of the supporting rod 16.

The height of the supporting rod 16 may be adjusted automatically or manually. Accordingly, the specific structure of the adjustment structure may be varied. For example, in case that the height of the supporting rod 16 is adjusted manually, one end of the first connection rod 41 is provided with the spherical structure 164, the other end of the first connection rod 41 is inserted into the second connection rod 42, and a connection block 44 is protruded from an outer circumferential wall of the first connection rod 41. The connection block 44 is elastically mounted to the first connection rod 41 by means of an elastic member 46. A plurality of through holes 47 is defined through an outer circumferential wall of the second connection rod 42 and is arranged along an axial direction of the second connection rod 42. The connection block 44 extends through a first through hole 47a of the through holes 47 to an outside of the second connection rod 42, thereby securing the first connection rod 41 to the second connection rod 42. When the height of the supporting rod 16 is needed to be adjusted, the connection block 44 is manually pressed toward an inside of the supporting rod 16, thereby enabling the connection block 44 to move toward the inside of the supporting rod 16 until the connection block 44 escapes from the first through hole 47a. At this point, the first connection rod 41 can move relative to the second connection rod 42. When the height of the supporting rod 16 is adjusted to a desired height, the connection block 44 is released and the connection block 44 is driven by the elastic member 46 to extend through a second through 47b of the through holes 47, thereby securing the first connection rod 41 to the second connection rod 42 again.

Figure 8A:
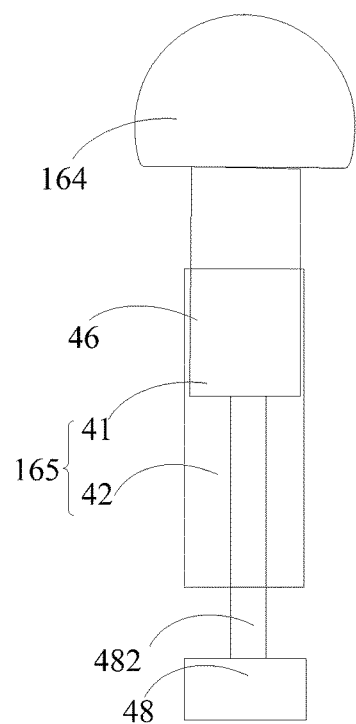
FIG. 8a is a schematic view of a supporting rod according to another embodiment of the present disclosure.

In one embodiment of the present disclosure, as shown in FIG. 8a, the adjustment structure includes a cylinder 48 connected with each supporting rod 16. An output shaft 482 of the cylinder 48 is connected with the first connection rod 41, thereby driving the first connection rod 41 to move relative to the second connection rod 42 so as to adjust the height of the supporting rod 16.

Figure 8B:
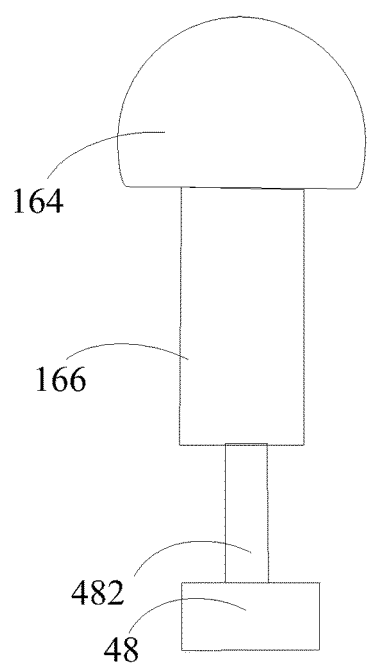
FIG. 8b is a schematic view of a supporting rod according to yet another embodiment of the present disclosure.

In one embodiment of the present disclosure, as shown in FIG. 8b, the supporting rod 16 is an integral structure, that is to say, the supporting rod 16 includes a rod structure 166. The adjustment structure includes a cylinder or motor 48, which controls the supporting rod to move up or down. An output shaft 482 of the cylinder or the motor 48 is connected with the rod structure 166.

Figure 8C:
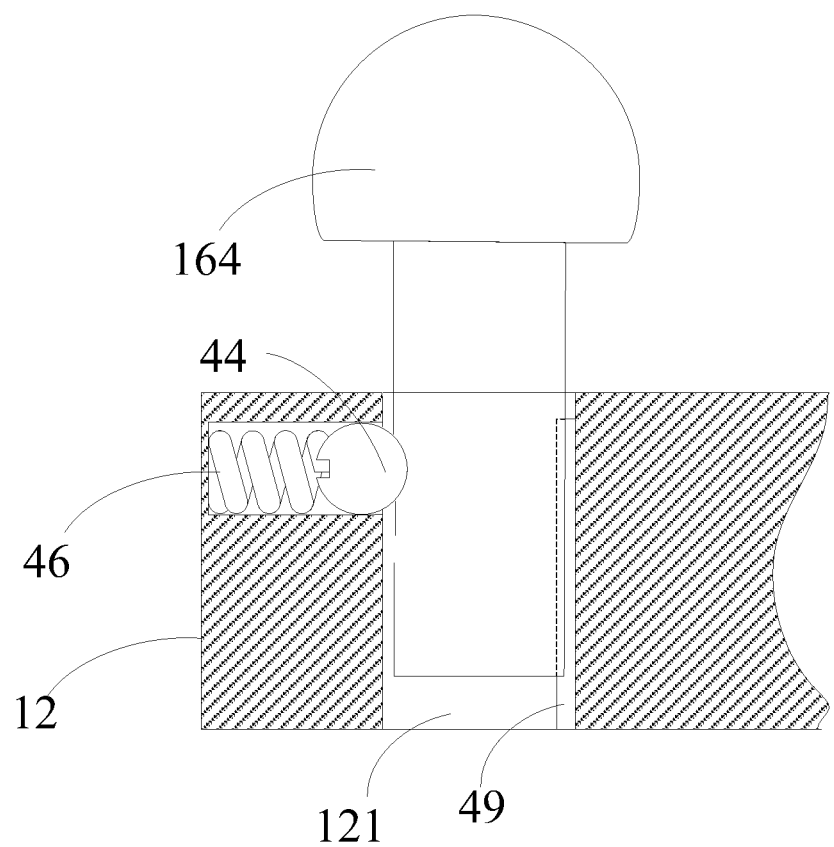
FIG. 8c is a schematic view of a supporting rod according to still another embodiment of the present disclosure.

In one embodiment of the present disclosure, as shown in FIG. 8c, the body 12 of the carrying platform 10 includes a hollow chamber 121. The adjustment structure includes a vertical rail 49 disposed in the hollow chamber 121 at a position corresponding to a corner of the mask plate 20. The supporting rod 16 is movably mounted on the rail 49.

As shown in FIG. 4, one embodiment of the present disclosure provides a mask plate 20. The mask plate 20 includes a substrate 22 and a second securing structure 24 on the substrate 22. The second securing structure 24 engages with the first securing structure 14 of the carrying platform 10 when the mask plate 20 is carried by the carrying platform 10.

The second securing structure 24 includes a first connection portion 31 disposed at an edge region of a lower surface 26 of the substrate 22 which faces the top surface 18 (as shown in FIG. 3) of the carrying platform 10. An engagement between the first connection portion 31 and the first securing structure 14 enables the mask plate 20 to be capable of rotating in a plane (which is parallel to the horizontal plane when the carrying platform 10 is at a position shown in FIG. 3) parallel to the top surface 18 of the carrying platform 10.

The second securing structure 24 further includes a second connection portion 32 disposed at the edge region of the lower surface 26 of the substrate 22 which faces the top surface 18 (as shown in FIG. 3) of the carrying platform 10. An engagement between the second connection portion 32 and the first securing structure 14 enables the mask plate 20 to be secured relative to the carrying platform 10.

The engagement between the first securing structure 14 of the carrying platform 10 and the second securing structure 24 of the mask plate 20 holds the mask plate 20 in the predetermined region 19 of the carrying platform 10. Further, the first securing structure 14 supports and fixes the mask plate 20 with the supporting rods 16. The presence of the first connection portion 31 enables the mask plate 20 to be capable of rotating in the horizontal plane, thereby realizing adjustment of the position of the mask plate 20 in the horizontal plane. The presence of the second connection portion 32 enables the mask plate 20 to be secured relative to the carrying platform 10. The above arrangements can reduce force applied on edges of the to-be-carried mask plate 20 and then reduce rate of occurrence of color mixing at the edges of the to-be-carried mask plate 20.

Figure 5:
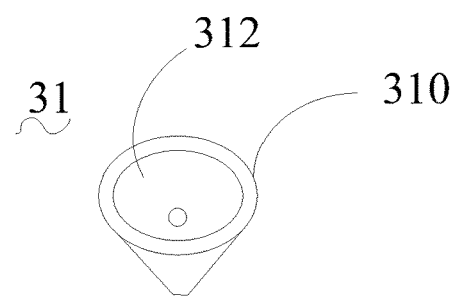
FIG. 5 is a schematic view of a first groove according to an embodiment of the present disclosure.
Figure 10:
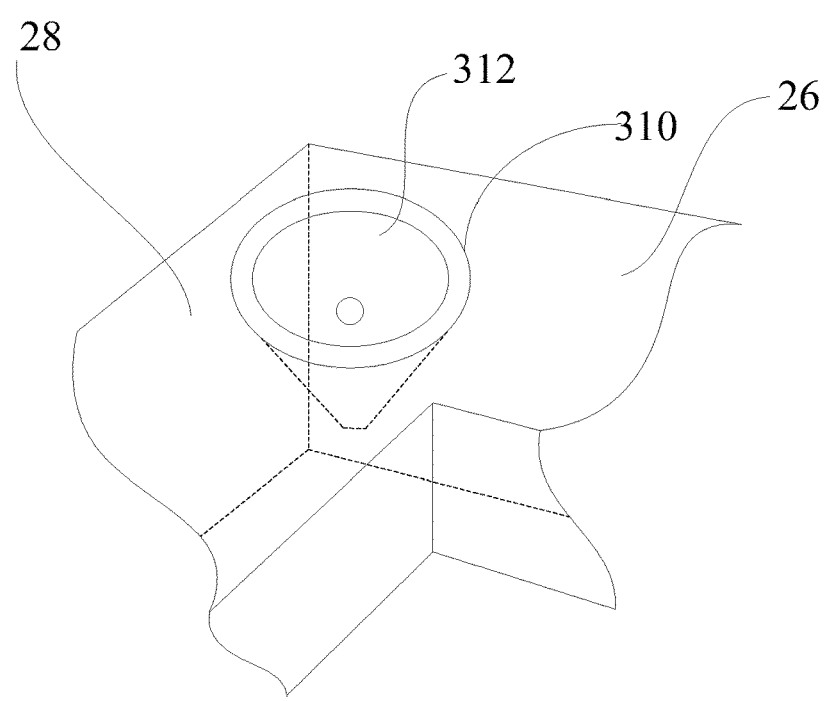
FIG. 10 is an enlarged view of a corner of the mask plate according to an embodiment of the present disclosure.

As shown in FIG. 4, FIG. 5 and FIG. 10, in one embodiment, the first connection portion 31 may include a first groove 310 defined in a first corner 28 of the mask plate 20. An inner surface 312 of the first groove 310 engages with the first securing structure 14, thereby enabling the mask plate 20 to rotate in the horizontal plane.

As shown in FIG. 10, the first connection portion 31 may include a bowl-shaped structure with an inner surface 312 being a curve surface. This facilitates engagement between the first securing structure 14 and the inner surface 312 of the first groove 310, and then facilitates rotation of the mask plate 20.

The first groove 310 may be formed by forming a cutout recessed inwardly in the first corner 28 of the mask plate 20.

Figure 11:
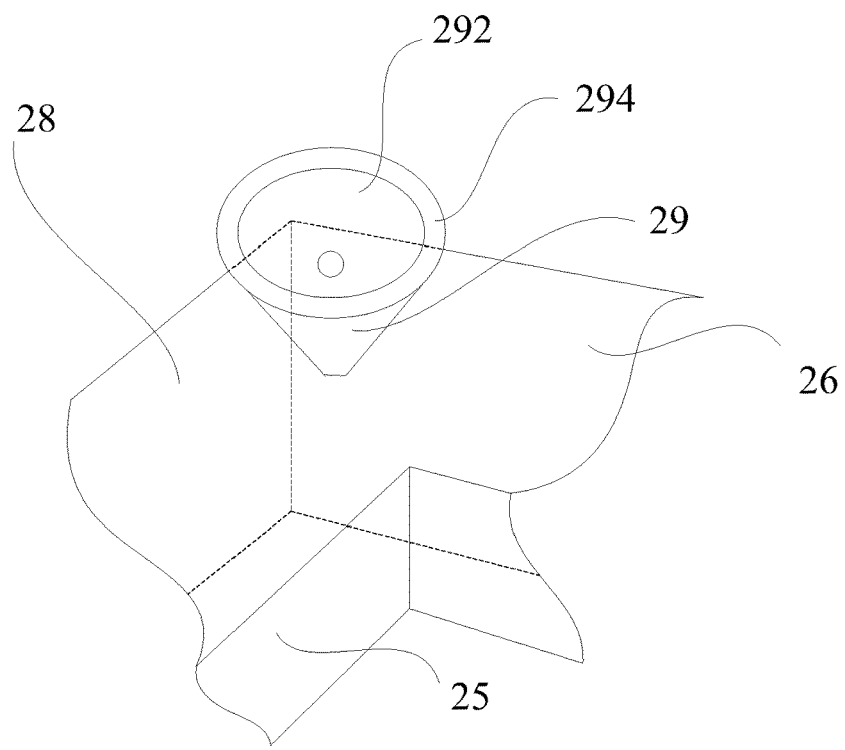
FIG. 11 is an enlarged view of a corner of the mask plate according to another embodiment of the present disclosure.

In one embodiment, as shown in FIG. 11, the first connection portion 31 may be a recess 292 of a bowl-shaped structure 29. The bowl-shaped structure 29 is secured on the first corner 28 of the mask plate 20 with an end surface 294 of the bowl-shaped structure 29 outside of the lower surface 26 of the mask plate 20. A height of the end surface 294 of the bowl-shaped structure 29 relative to a top surface 25 (as shown in FIG. 11) of the mask plate 26 is higher than a height of the lower surface 26 relative to the top surface 25 of the mask plate 26. In other words, the bowl-shaped structure 29 protrudes from the lower surface 26 of the mask plate 20. The bowl-shaped structure 29 may be integrally formed with the mask plate 20, or, the bowl-shaped structure 29 and the mask plate 20 may first be fabricated separately and then the bowl-shaped structure 29 is secured to the mask plate 20.

Figure 6:
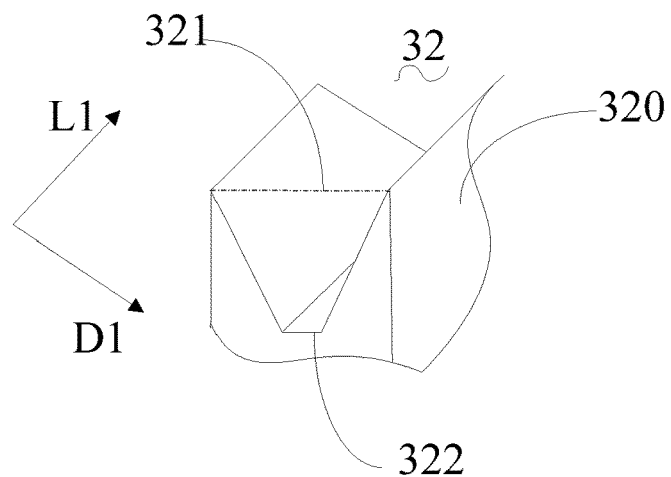
FIG. 6 is a schematic view of a second groove according to an embodiment of the present disclosure.
Figure 9:
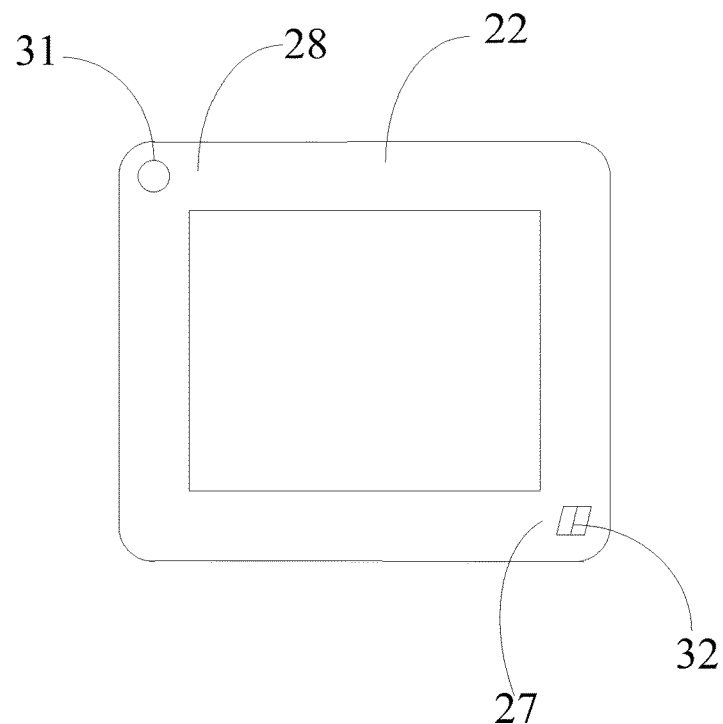
FIG. 9 is a schematic view of a mask plate according to an embodiment of the present disclosure.

As shown in FIG. 4 and FIG. 6, in one embodiment, the second connection portion 32 may include a second groove 320 defined in a second corner 27 of the mask plate 20. The second groove 320 is a strip-shaped groove. A length direction of the strip-shaped groove (i.e., a direction indicated by the arrow L1 as shown in FIG. 4 and FIG. 6) is perpendicular to a first direction D1 (as shown in FIG. 4 and FIG. 6). The first direction D1 is a direction of a tangent line that is tangent to a rotation path of the mask plate 20. The second corner 27 is adjacent the first corner 28 (as shown in FIG. 4), or the second corner 27 and the first corner 28 may be two diagonal corners of the substrate 22 (as shown in FIG. 9). In the embodiment shown in FIG. 4 and FIG. 6, the length direction of the strip-shaped groove is a direction from the second connection portion 32 to the first connection portion 31.

The presence of the first groove 310 enables the mask plate 20 to rotate in the horizontal plane only around the first groove 310. The second groove 320 can be used to prevent the mask plate 20 from rotating. A position of the second groove 32 may be adjacent a position of the first groove 310, or the positions of the second groove 32 and the first groove 310 are at two diagonal corners of the substrate 22, so as to ensure relative stability of the mask plate 20 and the carrying platform 10 and hold the mask plate 20 within the predetermined region 19.

In one embodiment of the present disclosure, a shape of a cross section of the second groove 320 in a plane perpendicular to the mask plate 20 is a trapezoid. One side of the trapezoid away from the carrying platform 10 has a length shorter than that of another side of the trapezoid close to the carrying platform 10 (i.e., as shown in FIG. 6, a length of a first side 322 is shorter than that of a second side 321; it should be noted that the second side does not really exit and is shown with dotted line). An area of a bottom of the second groove 320 is smaller than an area of a top opening of the second groove 320.

When the mask plate 20 is moved with its position changed, the supporting rod 16 moves in a direction towards the bottom of the second groove 320. The trapezoidal cross section of the second groove 320 makes the connection between the mask plate 20 and the carrying platform 10 more stable.

The second groove 320 may be formed by forming a cutout recessed inwardly in the second corner 27 of the mask plate 20.

Figure 12:
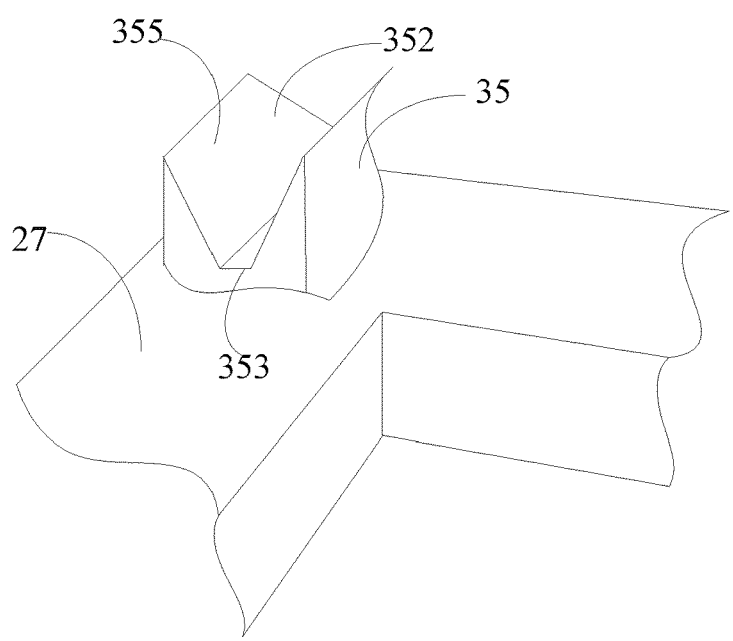
FIG. 12 is an enlarged view of a corner of the mask plate according to still another embodiment of the present disclosure.

In another embodiment of the present disclosure, as shown in FIG. 12, the second connection portion 32 may include a trapezoidal recess 352 of a protruding structure 35 disposed on the second corner 27. An area of a bottom 353 of the trapezoidal recess 352 is smaller than an area of a top opening 355 of the trapezoidal recess 352. The protruding structure 35 may be integrally formed with the mask plate 20, or the protruding structure 35 and the mask plate 20 may be fabricated separately and then the protruding structure 35 is secured to the mask plate 20.

One embodiment of the present disclosure further provides a mask plate securing assembly. The mask plate securing assembly includes a mask plate 20 and a carrying platform 10 for carrying the mask plate 20. The mask plate securing assembly further includes a first securing structure 14 and a second securing structure 24. An engagement between the first securing structure 14 and the second securing structure 24 holds the mask plate 20 in a predetermined region 19 of the carrying platform 10.

As shown in FIG. 2 and FIG. 3, the first securing structure 14 includes a plurality of supporting rods 16 disposed on a body 12 of the carrying platform 10. The supporting rods 16 are able to be in contact with an edge of the mask plate 20. As shown in FIG. 3 and FIG. 4, the second securing structure 24 includes a first connection portion 31 disposed on an edge region of a lower surface 26 of a substrate 22 of the mask plate 20, and the lower surface 26 faces a top surface 18 (as shown in FIG. 3) of the carrying platform 10. The first connection portion 31 is capable of being pivotally connected to a first supporting rod 16a of the supporting rods 16, thereby enabling the mask plate 20 to rotate in the horizontal plane.

The second securing structure 24 further includes a second connection portion 32 disposed on the edge region of the lower surface 26 of the substrate 22 of the mask plate 20. The second connection portion 32 is capable of being clamped with a second supporting rod 16b of the supporting rods 16, thereby securing the mask plate 20.

The engagement between the first securing structure 14 of the carrying platform 10 and the second securing structure 24 of the mask plate 20 can hold the mask plate 20 in the predetermined region 19 of the carrying platform 10. Further, the first securing structure 14 supports and fixes the mask plate 20 with the supporting rods 16. The presence of the first connection portion 31 of the second securing structure 24 enables the mask plate 20 to be capable of rotating in the horizontal plane, thereby realizing adjustment of the position of the mask plate 20 in the horizontal plane. The presence of the second connection portion 32 of the second securing structure 24 enables the mask plate 20 to be secured relative to the carrying platform 10. The above arrangements can reduce force applied on edges of the to-be-carried mask plate 20 and then reduce rate of occurrence of color mixing at the edges of the to-be-carried mask plate 20.

It should be noted that, the first securing structure 14 and the second securing structure 24 can not only hold the mask plate 20 within the predetermined region 19, but also adjust the position of the mask plate 20. The first securing structure 14 and the second securing structure 24 refer to fixation in dynamic sense, which includes a process of adjusting the mask plate 20 to a desired position and a process of holding and securing the mask plate 20. Further, the first securing structure 14 may include four supporting rods 16 disposed on the body 12 of the carrying platform 10. The four supporting rods 16 are corresponding to four corners of the mask plate 20, respectively.

Further, one end of the supporting rod 16 where the supporting rod 16 is in contact with the mask plate 20, is of a spherical structure 164.

Further, the first connection portion 31 may include a first groove 310 defined in a first corner 28 of the mask plate 20. An inner surface 312 of the first groove 310 is a curve structure that matches the spherical structure 164 of the first supporting rod 16a of the supporting rods 16.

Further, the second connection portion 32 may include a second groove 320 defined in a second corner 27 of the mask plate 20. The second groove 320 is a strip-shaped groove. A length direction of the strip-shaped groove (i.e., a direction indicated by the arrow L1 as shown in FIG. 4 and FIG. 6) is perpendicular to a first direction D1 (as shown in FIG. 4 and FIG. 6). The first direction D1 is a direction of a tangent line that is tangent to a rotation path of the mask plate 20. The second corner 27 is adjacent the first corner 28 (as shown in FIG. 4), or the second corner 27 and the first corner 28 may be two diagonal corners of the substrate 22 (as shown in FIG. 9).

Further, a shape of a cross section of the second groove 320 in a plane perpendicular to the mask plate 20 is a trapezoid. One side of the trapezoid away from the carrying platform 10 has a length shorter than that of another side of the trapezoid close to the carrying platform 10.

Further, the mask plate securing assembly further includes an adjustment structure, which is to adjust a height of each supporting rod 16 relative to the top surface 18 of the body 12, so that the mask plate 20 on the carrying platform 10 is parallel to the horizontal plane. The adjustment structure includes a first connection rod 41 and a second connection rod 42. The second connection rod 42 is telescopically mounted on the first connection rod 41, thereby forming a rod body 165 of the supporting rod 16, as shown in FIG. 7.

In actual application, in the process of placing the mask plate 20 on the carrying platform 10, the first securing structure 14 may first engage with the first connection portion 31, so that the mask plate 20 can be adjusted to the desired position. After the mask plate 20 is adjusted to the desired position, the first securing structure 14 engages with the second connection portion 32, thereby stably securing the mask plate 20 to the carrying platform 10. Or, the mask plate 20 may be directly placed on the four supporting rods 16 in such a manner that contacting between the first groove 310 and the first supporting rod 16a, the contacting between the second grove 320 and the second supporting rod 16b and the contacting between other two corners of the mask plate 20 and other two corresponding supporting rods 16 occur simultaneously. At this point, due to the presence of the spherical structure 164 at one end of the supporting rod 16, the engagement between the first groove 310 and the corresponding supporting rod 16a as well as the spherical structure 164 of the supporting rod 16b in the top opening of the second groove 320, the mask plate 20 can still rotate in the horizontal plane, but a rotation range of the mask plate 20 is limited due to the engagement between the second groove 320 and the corresponding supporting rod 16b, thereby ensuring a mark of the mask plate 20 in the predetermined region 19 all the time. When the mask plate 20 is moved, the supporting rod 16b moves in a direction towards the bottom of the second groove 320, and the trapezoidal cross section of the second groove 320 makes the connection between the mask plate 20 and the carrying platform 10 more stable.

The presence of the adjustment structure can ensure that the mask plate 20 is always in the horizontal plane without tilting.

As can be seen from FIG. 3 to FIG. 6, since the first groove 310 and the second groove 320 are defined in the first corner 28 and the second corner 27 at a left side of the mask plate 20, respectively, heights of the left supporting rod 16a and the right supporting rod 16b in FIG. 3 are adjusted by the adjustment structure to be different, thereby ensuring the whole mask plate 20 is in the horizontal plane. In other words, by adjusting the heights of the supporting rods 16a and 16b relative to the top surface 18 of the body 12, it can ensure that the whole mask plate 20 is in the horizontal plane.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A carrying platform for carrying a mask plate, comprising:
a body;
a first securing structure on the body; and
an adjustment structure;
wherein the first securing structure is configured to engage with a second securing structure of the mask plate;
wherein the first securing structure includes a plurality of supporting rods on the body, and the supporting rods are configured to be in contact with an edge region of the mask plate;
wherein an engagement between the first securing structure and the second securing structure enables the mask plate to be switched between a first state and a second state in such a manner that in the first state, the mask plate is in contact with a first supporting rod of the supporting rods and rotates around an axis of the first supporting rod in a horizontal plane, and in the second state, the mask plate is in contact with at least two of the supporting rods and is fixed relative to the carrying platform;
wherein the adjustment structure is configured to adjust a height of each supporting rod so that the mask plate on the carrying platform is substantially parallel to the horizontal plane; and
wherein the adjustment structure includes a first connection rod and a second connection rod, and the second connection rod is telescopically mounted on the first connection rod, thereby forming a rod body of one of the supporting rods.

2. The carrying platform of claim 1, wherein the first securing structure includes four supporting rods on the body, and the four supporting rods are corresponding to four corners of the mask plate in a one-to-one manner.

3. The carrying platform of claim 2, wherein one end of each supporting rod where each supporting rod is in contact with the mask plate, is of a spherical structure.

4. The carrying platform of claim 1, wherein the adjustment structure further includes a cylinder or a motor, and an output shaft of the cylinder or the motor is connected with the first connection rod.

5. The carrying platform of claim 1, wherein the adjustment structure further includes a connection block elastically mounted to the first connection rod by means of an elastic member; a plurality of through holes is defined through an outer circumferential wall of the second connection rod and is arranged along an axial direction of the second connection rod; and one portion of the connection block protrudes from an outer circumferential wall of the first connection rod and extends into one of the through holes.

6. A carrying platform for carrying a mask plate, comprising:
a body;
a first securing structure on the body; and
an adjustment structure;
wherein the first securing structure is configured to engage with a second securing structure of the mask plate;
wherein the first securing structure includes a plurality of supporting rods on the body, and the supporting rods are configured to be in contact with an edge region of the mask plate;
wherein an engagement between the first securing structure and the second securing structure enables the mask plate to be switched between a first state and a second state in such a manner that in the first state, the mask plate is in contact with a first supporting rod of the supporting rods and rotates around an axis of the first supporting rod in a horizontal plane, and in the second state, the mask plate is in contact with at least two of the supporting rods and is fixed relative to the carrying platform;
wherein the adjustment structure is configured to adjust a height of each supporting rod so that the mask plate on the carrying platform is substantially parallel to the horizontal plane; and
wherein the body includes a hollow chamber; the adjustment structure includes a rail in the hollow chamber; and one of the supporting rods is movably mounted on the rail.

7. A mask plate securing assembly, comprising:
a carrying platform;
a mask plate stacked on the carrying platform in a first direction which is substantially perpendicular to the carrying platform;
a first connection portion disposed at a surface of the mask plate which faces the carrying platform;
a second connection portion disposed at the surface of the mask plate which faces the carrying platform, wherein the second connection portion is spaced from the first connection portion;
a plurality of supporting rods, comprising a first supporting rod and a second supporting rod; and
an adjustment structure that is configured to adjust a height of each supporting rod so that the mask plate on the carrying platform is substantially parallel to the horizontal plane;
wherein the first supporting rod is arranged on the carrying platform, and wherein the first supporting rod is configured to move relative to the carrying platform and the mask plate, thereby enabling a free end of the first supporting rod to pivotally engage with or disengage from the first connection portion;
wherein the second supporting rod is arranged the carrying platform, and wherein the second supporting rod is configured to move relative to the carrying platform and the mask plate, thereby enabling a free end of the second supporting rod to engage with the second connection structure so as to limit rotation of the free end of the first supporting rod relative to the first connection portion, or enabling the free end of the second supporting rod to disengage from the second connection portion; and
wherein the adjustment structure includes a first connection rod and a second connection rod, and the second connection rod is telescopically mounted on the first connection rod, thereby forming a rod body of one of the supporting rods.

8. The mask plate securing assembly of claim 7, wherein the free end of the first supporting rod is of a spherical structure;
the free end of the second supporting rod is of a spherical structure;

the first connection portion includes a curved structure that pivotally engages with the spherical structure of the first supporting rod; and the second connection portion includes a strip-shaped groove, and a length direction of the strip-shaped groove is substantially parallel to a direction from the first connection portion to the second connection portion.

9. The mask plate securing assembly of claim 8, wherein a shape of a cross section of the strip-shaped groove in a plane which is substantially perpendicular to the mask plate is a trapezoid, one side of the trapezoid away from the carrying platform has a length shorter than that of another side of the trapezoid close to the carrying platform.

10. The mask plate securing assembly of claim 7, wherein the first direction is substantially perpendicular to the carrying platform and the mask plate.

11. The mask plate securing assembly of claim 7, wherein the first supporting rod and the second supporting rod are located between the carrying platform and the mask plate.

* * * * *